(12) United States Patent
Lee et al.

(10) Patent No.: US 6,728,162 B2
(45) Date of Patent: Apr. 27, 2004

(54) DATA INPUT CIRCUIT AND METHOD FOR SYNCHRONOUS SEMICONDUCTOR MEMORY DEVICE

(75) Inventors: Jung-bae Lee, Suwon (KR); One-gyun La, Suwon (KR)

(73) Assignee: Samsung Electronics Co. LTD, Suwon (KR)

(*) Notice: Subject to any disclaimer, the term of this patent is extended or adjusted under 35 U.S.C. 154(b) by 2 days.

(21) Appl. No.: 10/081,546

(22) Filed: Feb. 21, 2002

(65) Prior Publication Data

US 2002/0122348 A1 Sep. 5, 2002

(30) Foreign Application Priority Data

Mar. 5, 2001 (KR) ........................................ 2001-24044
Jul. 21, 2001 (KR) ........................................ 2001-44065

(51) Int. Cl.[7] ................................................ G11C 8/00
(52) U.S. Cl. ................... 365/233; 365/189.05; 365/219
(58) Field of Search ........................... 365/189.05, 194, 365/219, 233, 236

(56) References Cited

U.S. PATENT DOCUMENTS

| | | | | |
|---|---|---|---|---|
| 6,078,546 A | | 6/2000 | Lee | 365/233 |
| 6,115,322 A | * | 9/2000 | Kanda et al. | 365/233 |
| 6,147,926 A | * | 11/2000 | Park | 365/233 |
| 6,229,757 B1 | | 5/2001 | Nagata et al. | 365/233 |
| 6,292,410 B1 | | 9/2001 | Yi et al. | 365/193 |
| 6,324,119 B1 | * | 11/2001 | Kim | 365/233 |
| 6,407,963 B1 | * | 6/2002 | Sonoda et al. | 365/233.5 |

* cited by examiner

*Primary Examiner*—Son Mai
(74) *Attorney, Agent, or Firm*—F. Chau & Associates, LLC

(57) ABSTRACT

A circuit for receiving data to be written in a synchronous semiconductor memory device, comprising: a first set of latches for receiving an n-bit data upon transition of an internal strobe signal; a counter for counting the number of transitions of the internal strobe signal and for outputting an indicating signal upon counting the end of a string of internal strobe signals; a second set of latches for receiving the outputs of the first set of latches, the second set of latches being clocked by the indicating signal; and a third set of latches for receiving the outputs of the second set of latches, the third set of latches being clocked by a clock signal derived from a system clock.

21 Claims, 12 Drawing Sheets

DATA INPUT CIRCUIT AND METHOD FOR SYNCHRONOUS SEMICONDUCTOR MEMORY DEVICE

BACKGROUND OF THE INVENTION

1. Technical Field

Disclosed is a synchronous semiconductor memory device. In particular, a circuit and a method for writing data into a synchronous semiconductor memory.

2. Discussion of the Related Art

The operational speed and performance of a synchronous dynamic random access memory SDRAM is improved over a dynamic random access memory (DRAM) when the SDRAM is operated in synchronization with an external system clock and there are frequent sequential data read/write operations.

The operational speed and performance of an SDRAM is further improved when both the rising and falling edges of the system clock is used in reading and writing data, i.e., the clock rate is effectively doubled. This memory device is called the double data rate (DDR) SDRAM. In a DDR SDRAM, a strobe signal, commonly referred to as "DQS", is used in conjunction with the system clock to strobe and clock memory data.

U.S. Pat. No. 6,078,546 to Lee discloses a synchronous semiconductor device having a double data rate input circuit which allows data to be written in the device in response to a clock signal and a data strobe signal. FIG. 1A shows an input circuit disclosed in the '546 patent which stores a pair of data which is synchronized with either the system clock signal or the data strobe signal. Referring to FIG. 1A, an externally applied data strobe signal DS is received during a data write operation. An edge detector 300 detects an edge of the data strobe signal DS and generates first and second internal strobe signals DS1 and DS2 in synchronization with rising and falling edges of the data strobe signal DS, respectively. The signals DS1 and DS2 are used to strobe the odd and even data into data registers 303A and 303B, respectively. A second edge detector 301 detects an active edge of a system clock. A delay circuit 304 delays the output of the second edge detector 301 and the delayed clock signal CLKD is used to output the data from the data registers to write driver 305.

FIG. 1B shows the structure of the data register 303. Referring to FIG. 1B, the first or the odd data of the pair of data is input first to unit cell R1, where it is strobed by strobe signal DS1 and the complement of DS1. The output of R1 is fed to R2. Unit cell R3 receives the even or the second data bit of the data pair. Unit cells R2 and R3 are both first strobed by a strobe signal DS2 (AWR) and its complement. DS2 (AWR) is a product of the DS2 strobe signal and the write pulse to synchronize the strobe signals to the write operation. The odd and even data pair is then output with clocking by the delayed clock signal CLKD.

FIG. 2 shows a timing diagram of the data write operations of the circuit of FIG. 1A. The timing diagram shows the strobe and clock operations for a 4-bit data string input from DIND. The storage cell R1 stores the odd numbered data D0 and D2 of the data string in synchronism with internal data strobe signals DS1 and its complement/DS1. The storage cell R3 stores the even numbered D1 and D3 in synchronism with strobe signals DS2 and its complement/DS2. The write drivers are activated with the first active external clock signal CLK after the write command WR. Case I illustrates that the data reaches the register circuit 303 with the valid data strobe signals inputted after reference clock signal CLK(0), namely in a case where the value of the t DQSS is maximum. Case II illustrates that data reaches the register circuit 303 with the valid data strobe signals inputted before the reference clock signal CLK(0), namely, in the case where the value of the t DQSS is minimum. The disclosure of U.S. Pat. No. 6,078,546 in its entirety is incorporated by reference herein.

As operational speed of memory devices are further increased, the timing margin between the external system clock and the data strobe signal DS becomes shorter. Accordingly, a need exists for an improved system and method for writing a string of data into a synchronous memory device with increased timing margin.

SUMMARY OF THE INVENTION

According to the present invention, a circuit for receiving data for a synchronous semiconductor memory device is provided, comprising: a strobe generator having a flip flop and a plurality of logic gates for generating S(n) internal strobes based on an external strobe signal, each of the S(n) internal strobes having a latch-triggering transition occurring one after another in response to the external strobe signal; a plurality of latches for receiving an n-bit data, including at least one set of latches being clocked by the S(n)th internal strobe and another set of latches for receiving the outputs from the one set of latches, the another set of latches being clocked by an internal clock signal having a period longer than that of an external clock signal and a data write driver for receiving the outputs of the another set of latches and for driving the n-bit data into memory cells of the memory device under clocking control of the external clock.

The circuit further including a frequency divider for dividing by two the external clock signal to derive the internal clock signal for clocking the another set of latches. The plurality of latches includes a first set of L(n−1) latches for receiving respective (n−1) bits of an n-bit data, each of the first set of latches being clocked by a respective S(n−1) internal strobe, and a second set of latches configured to receive respective outputs of the first set L(n−1) latches and the nth bit data, the second set of latches being clocked by the S(n)th internal strobe, and a third set of latches for receiving respective outputs of the second set of latches, the third set of latches being clocked by the internal clock signal, the external clock signal being derived from an external memory controller.

Further, the flip flop in the strobe generator is configured as a frequency divider for dividing by two the external strobe signal, and the complementary outputs of the flip flop are applied to the inputs of four AND gates to produce the S(n) internal strobes. Preferably, the semiconductor memory device is a double data rate SDRAM, and wherein (n) is equal to four (4).

A circuit is also provided for receiving data to be written in a synchronous semiconductor memory device, comprising: a first set of latches for receiving an n-bit data upon transition of an internal strobe signal; a counter for counting the number of transitions of the internal strobe signal and for outputting an indicating signal upon counting the end of a string of internal strobe signals; a second set of latches for receiving the outputs of the first set of latches, the second set of latches being clocked by the indicating signal; and a third set of latches for receiving the outputs of the second set of latches, the third set of latches being clocked by a clock signal derived from a system clock, wherein the counter is clocked by a first clock derived from the system clock.

Preferably, the first clock is derived from a falling edge of the system clock, and a counter reset signal is generated based on the falling edge of the system clock after a write command, the counter reset signal for resetting the counter. The first set of latches receives the n-bit data serially under clocking control by the internal strobe signal. The second set of latches receives the latched n-bit data in parallel, wherein the indicating signal is output by the counter upon detecting two transitions of the internal strobe signal, and (n) is equal to four.

Accordingly to another aspect of the invention, a circuit for receiving data to be written in a synchronous semiconductor memory device is provided, comprising: a first set of latches for receiving an n-bit data upon transition of an internal strobe signal; a counter for counting the number of falling edges of an external strobe signal and for outputting a counting signal; an indicating signal generator for receiving the counting signal outputted from the counter and for outputting an indicating signal; a second set of latches for receiving the outputs of the first set of latches, the second set of latches being clocked by the indicating signal; and a third set of latches for receiving the outputs of the second set of latches, the third set of latches being clocked by a clock signal derived from a system clock, wherein the counter is clocked by a first clock derived from the system clock.

Accordingly to still another aspect of the invention, a circuit for receiving data to be written in a synchronous semiconductor memory device is provided, comprising: a first set of latches for receiving an n-bit data upon transition of a first internal strobe signal buffered from a data strobe buffer; a counter for counting the number of rising edges of a second internal strobe signal outputted from the data strobe buffer and for outputting a counting signal; an indicating signal generator for receiving the counting signal outputted from the counter and for outputting an indicating signal; a second set of latches for receiving the outputs of the first set of latches, the second set of latches being clocked by the indicating signal; and a third set of latches for receiving the outputs of the second set of latches, the third set of latches being clocked by a clock signal derived from a system clock.

Preferably, a counter reset signal is generated based on the falling edge of the system clock after a write command, the counter reset signal for resetting the counter; and the clock signal is derived by dividing by two the system clock.

A semiconductor memory device is further provided for accessing data in synchronization with an external clock signal, comprising: a converting circuit for outputting at least four bits of serial data as four bits of parallel data in response to a data strobe signal, and a latch circuit for receiving the four bit of parallel data in response to a first clock signal and outputting the four bit of parallel data to a data write circuit in response to the first clock signal, wherein each of the four bits of parallel data has a valid data window corresponding to at least two clock cycles of the external clock signal, wherein the semiconductor memory device further includes a division circuit for dividing an internal clock signal outputted from a clock buffer to output the first clock signal.

According to a further aspect of the present invention, a semiconductor memory device for accessing data in synchronization with rising and falling edges of a clock signal is provided, the semiconductor memory device comprising: a division circuit for generating a second data strobe signal by dividing a first data strobe signal; a plurality of internal strobe signal generating circuits for receiving the first data strobe signal and the second data strobe signal and generating a plurality of internal strobe signals; a plurality of first latch circuits for sequentially latching a plurality of received serial data in synchronization with each of the plurality of internal strobe signals; a second latch circuit for receiving and storing data from the first latch circuit in synchronization with one of the plurality of internal strobe signals; and an output circuit for receiving data from the second latch circuit in response to a predetermined clock signal, and transferring the received data to a data bus line.

The semiconductor memory device further includes: a second division circuit for generating a second clock signal by dividing a first clock signal; and an output circuit for transferring an output signal of the second latch circuit into a data bus line in response to the second clock signal.

A data input circuit for inputting data into a semiconductor memory device is also provided, comprising: a converting circuit for converting serial data into parallel data in synchronization with rising and falling edges of a data strobe signal; a data strobe counter for receiving the data strobe signal and an internal clock signal, for counting the number of pulses of the data strobe signal at an interval where the data strobe signal is enabled, and outputting a count signal corresponding to the number of the pulse signals of the data strobe signal; a first latch circuit for receiving and latching output data of the converting circuit in response to the count signal; and a second latch circuit for receiving and latching output data of the first latch circuit in response to the internal clock signal, wherein the data strobe counter receives a write command signal and is initialized in response to a first transition of the internal clock signal after a valid data strobe signal is input.

Preferably, the data input circuit further includes an indicating signal generating circuit for receiving the count signal and outputting an indicating signal for clocking the first latch circuit, wherein the converting circuit comprises: a third latch circuit for latching odd-numbered data of the serial data in response to the data strobe signal; and a fourth latch circuit for latching even-numbered data of the serial data in response to the data strobe signal, wherein the count signal is generated by counting the number of falling edges of the data strobe signal at the interval where the data strobe signal is enabled.

A data input circuit is also provided, comprising a first register for latching first data input in response to a rising edge of a first pulse signal of a data strobe signal, a second register for receiving and latching output data of the first register in response to a falling edge of the first pulse signal, a third register for receiving and storing output data of the second register in response to a rising edge of a second pulse signal of the data strobe signal, and a fourth register for receiving and storing output data of the third register in response to a falling edge of the second pulse signal; a second latching means comprising a fifth register for latching second data input in response to the falling edge of the first pulse signal of the data strobe signal, a sixth register for receiving and storing output data of the fifth register in response to the rising edge of the second pulse signal of the data strobe signal, and a seventh register for receiving and storing output data of the sixth register in response to the falling edge of the second pulse signal; a third latching means for storing third data input in response to the rising edge of the second pulse signal of the data strobe signal into the third register through the first register and the second register, storing fourth data input in response to the falling edge of the second pulse signal of the data strobe signal into the sixth register through the fifth register, and receiving and storing data from the fourth register of the first latching means in response to an indicating signal generated in response to the falling edge of the second pulse signal of the data strobe signal; a fourth latching means for receiving and storing data stored into the seventh register of the second latching means in response to the indicating signal; a fifth latching means for receiving and storing data stored into the third register of the first latching means in response to the indicating signal; and a sixth latching means receiving and storing data stored into the sixth register of the second latching means in response to the indicating signal.

According to the present invention, a data input method for inputting data in a semiconductor memory device is provided, comprising the steps of: converting N bits of serial data into N bits of parallel data in synchronization with a data strobe signal; transmitting the N bits of parallel data to a first circuit in response to a predetermined signal outputted after the last falling edge of the data strobe signal; and outputting the N bits of parallel data of the first circuit to a second circuit in response to a clock signal derived from an external clock signal, wherein the predetermined signal is derived by counting signal generated from a counter, wherein the clock signal is derived by dividing the external clock signal.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF PREFERRED EMBODIMENTS

Figure 1A:
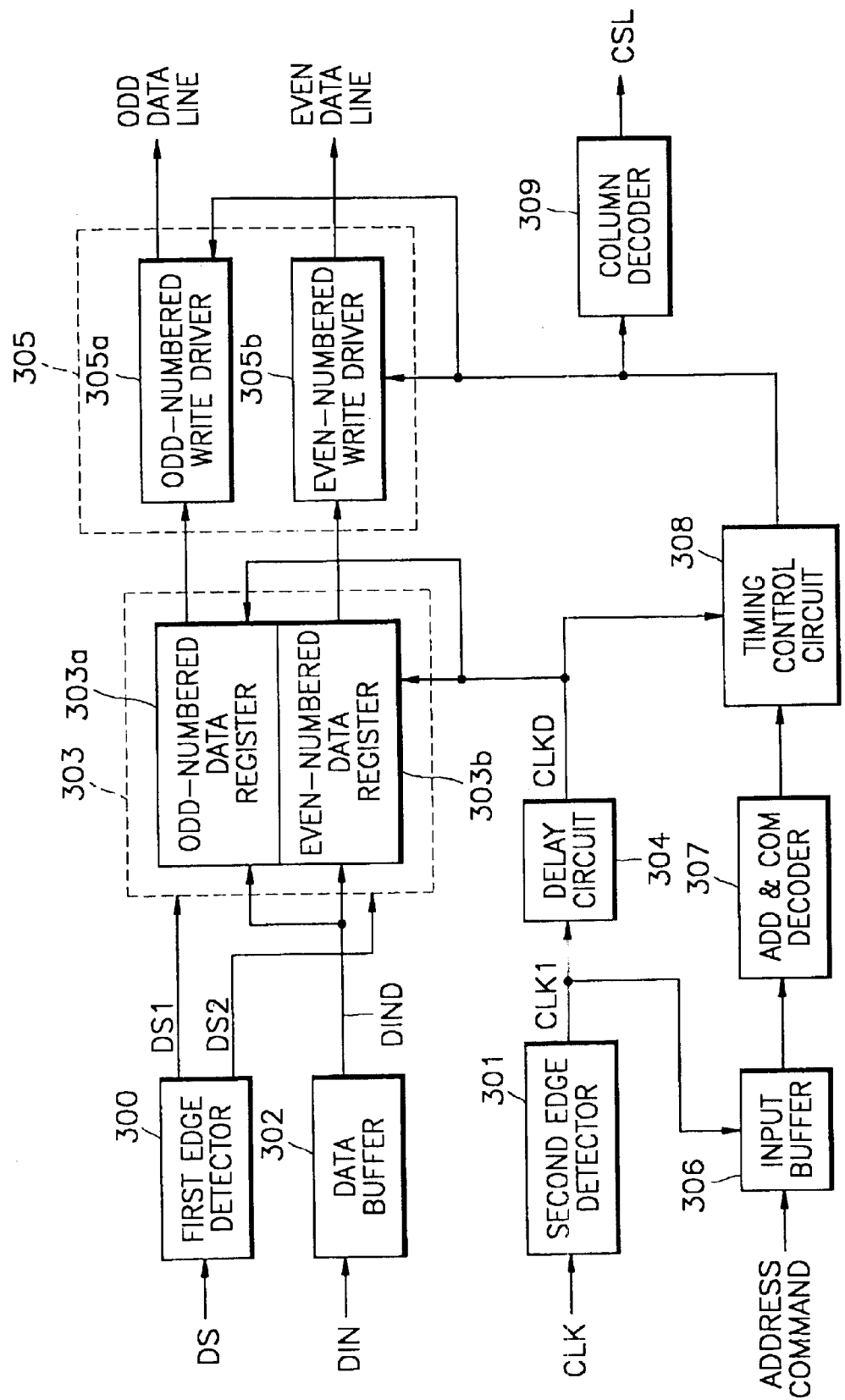
FIG. 1A is a block diagram of a conventional synchronous semiconductor memory device.
Figure 1B:
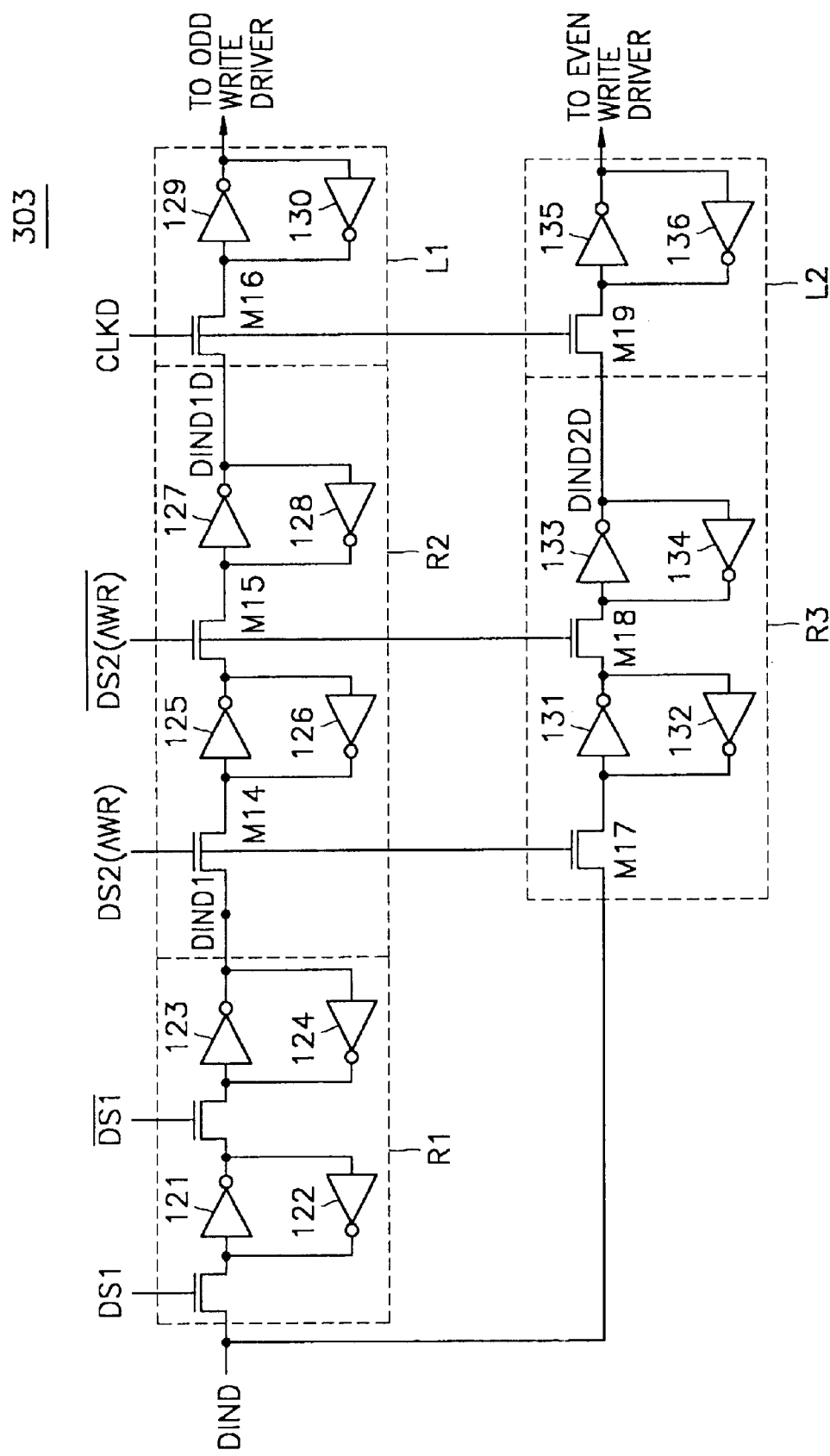
FIG. 1B is a detailed circuit diagram of a data register for the semiconductor memory device shown in FIG. 1A.
Figure 2:
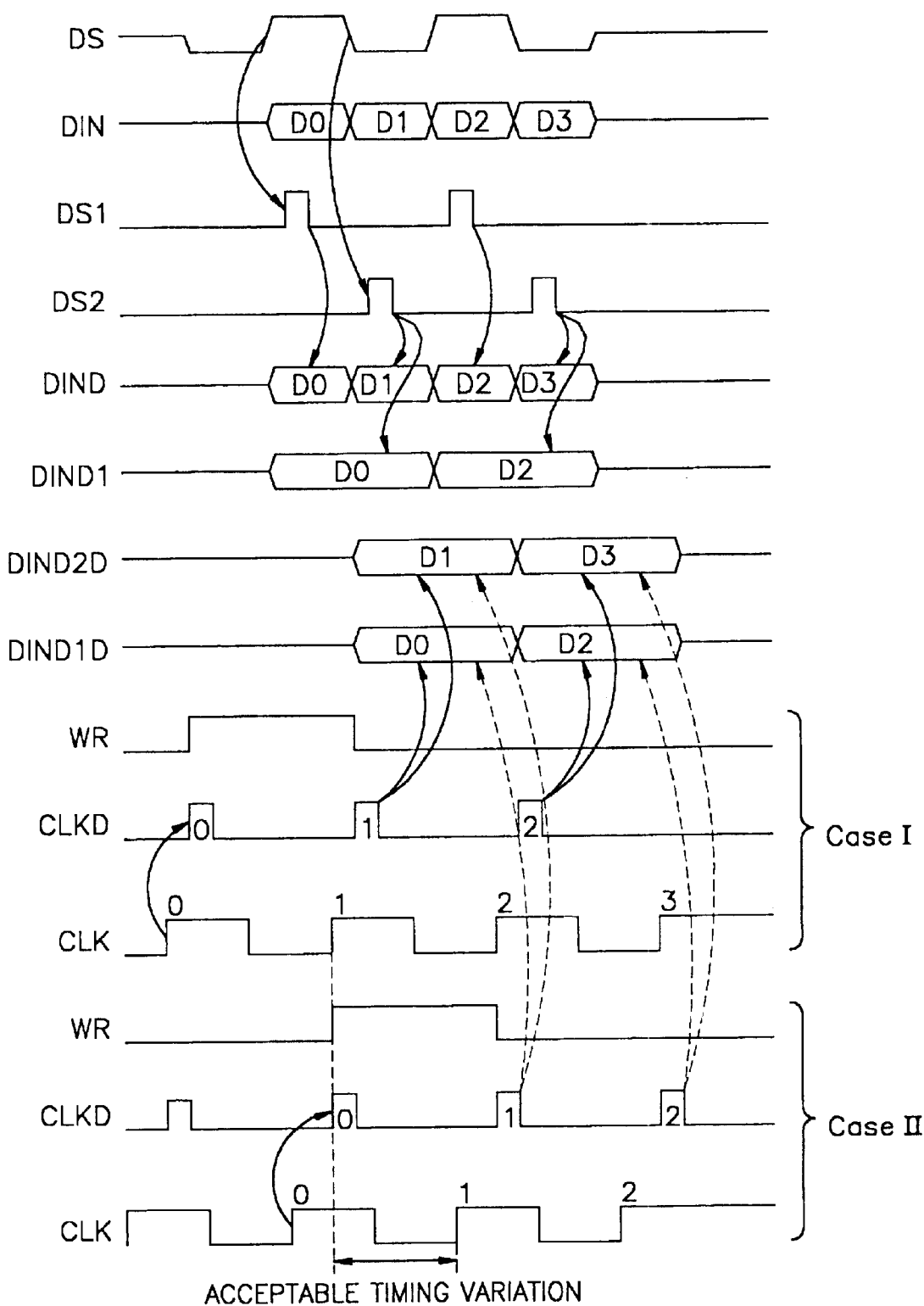
FIG. 2 is a timing diagram of a data write operation for the semiconductor memory device shown in FIG. 1A.

The features and advantages of the present invention will become more apparent from the detailed description of preferred embodiments with reference to the accompanying drawings, like reference numerals are used for description of like or equivalent parts or portions for simplicity of illustration and explanation.

Figure 3:
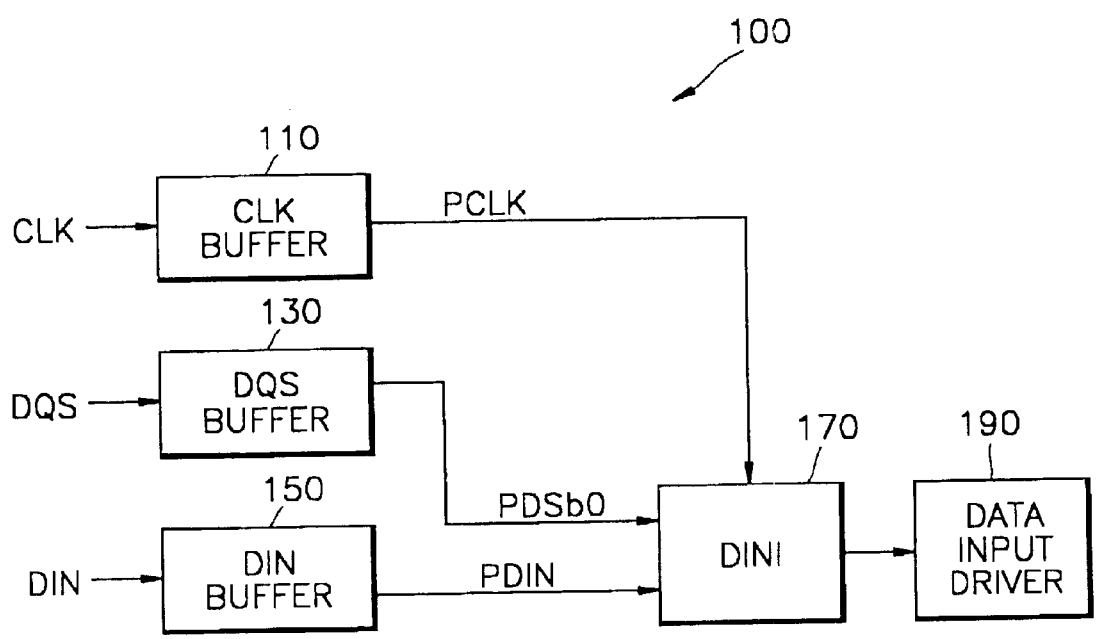
FIG. 3 is a block diagram of a data prefetch system according to a first embodiment of the present invention.

FIG. 3 is a block diagram of a data prefetch system according to the first embodiment of the present invention. Referring to FIG. 3, a data prefetch system 100 includes a clock buffer 110, a data strobe buffer 130, a data input buffer 150, a data input circuit 170, and a data input driver 190.

The clock buffer 110 generates an internal clock signal PCLK in response to a first edge of an external clock signal CLK, and the data strobe buffer 130 generates a first internal data strobe signal PDSb0 by buffering a data strobe signal DQS.

The data input buffer 150 generates internal data PDIN having an N-bit data string by buffering external data DIN having the N-bit data string, and the data input circuit 170 converts N bits of serial data PDIN into N bits of parallel data under control of the first internal data strobe signal PDSb0. The internal clock signal PCLK clocks the parallel data to output the N bits to the data input driver 190. The data input driver 190 drives the output signal of the data input circuit 170 into a memory cell array (not shown).

Figure 4:
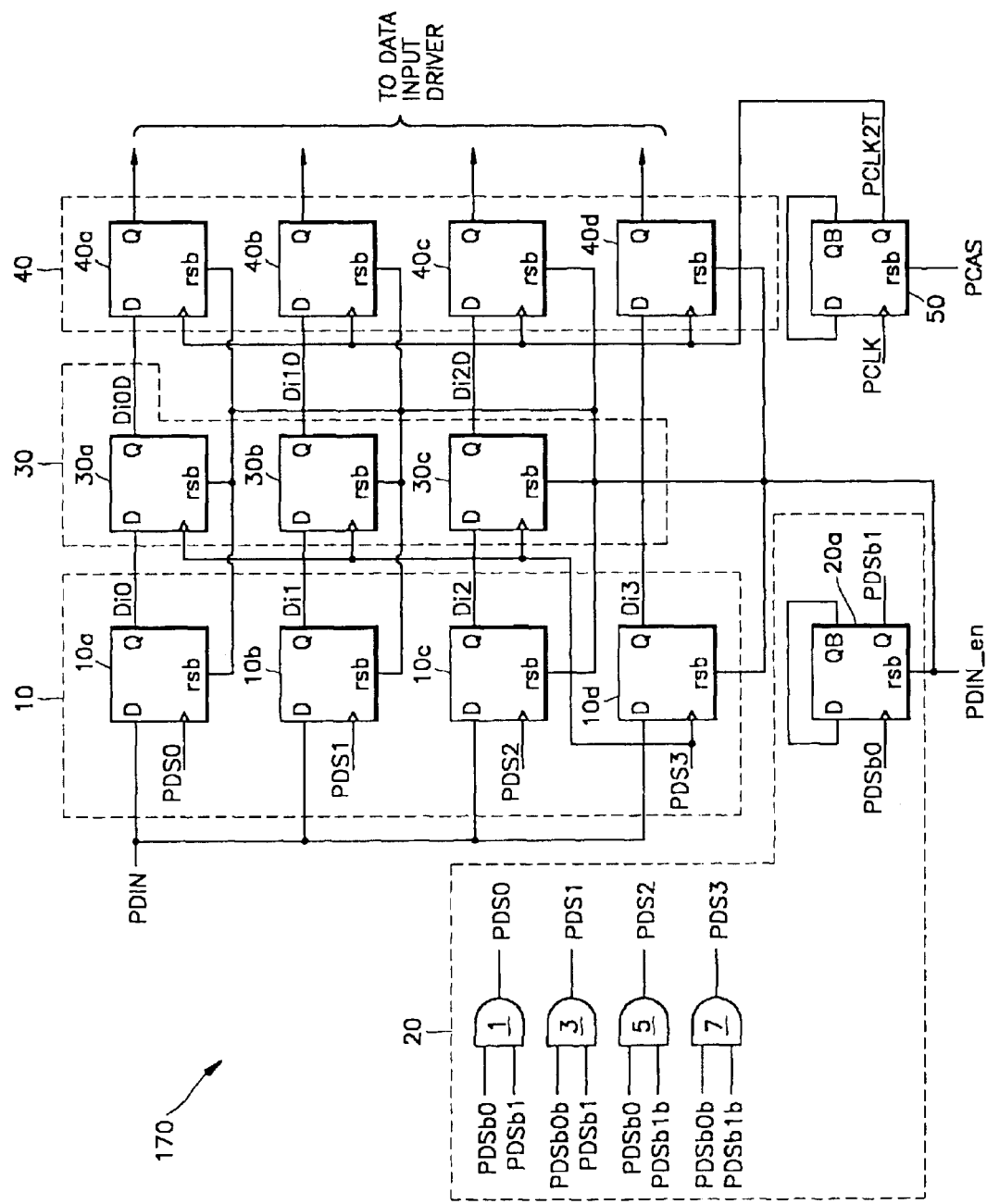
FIG. 4 is a circuit diagram of the data input circuit shown in FIG. 3.

FIG. 4 is a circuit diagram of the data input circuit 170 shown in FIG. 3. For illustration, the data input circuit 170 is shown as a serial input parallel output circuit that operates with a 4-bit prefetch. 4 bits of serial data are input from DIN buffered by DIN buffer 150 and output as PDIN (0~3) into data input circuit 170, which in turn converts the 4 bits of serial data into 4 bits of parallel data and in synchronization with rising and falling edges of internal data strobe signal PDSb0 and its progeny. The 4 bits of parallel data are written into a memory array in response to a clock signal derived from a system clock.

Referring to FIG. 4, the data input circuit 170 includes a first latch circuit 10, a logic circuit 20, a second latch circuit 30, an output circuit 40, and a clock frequency-division circuit 50.

Figure 5:
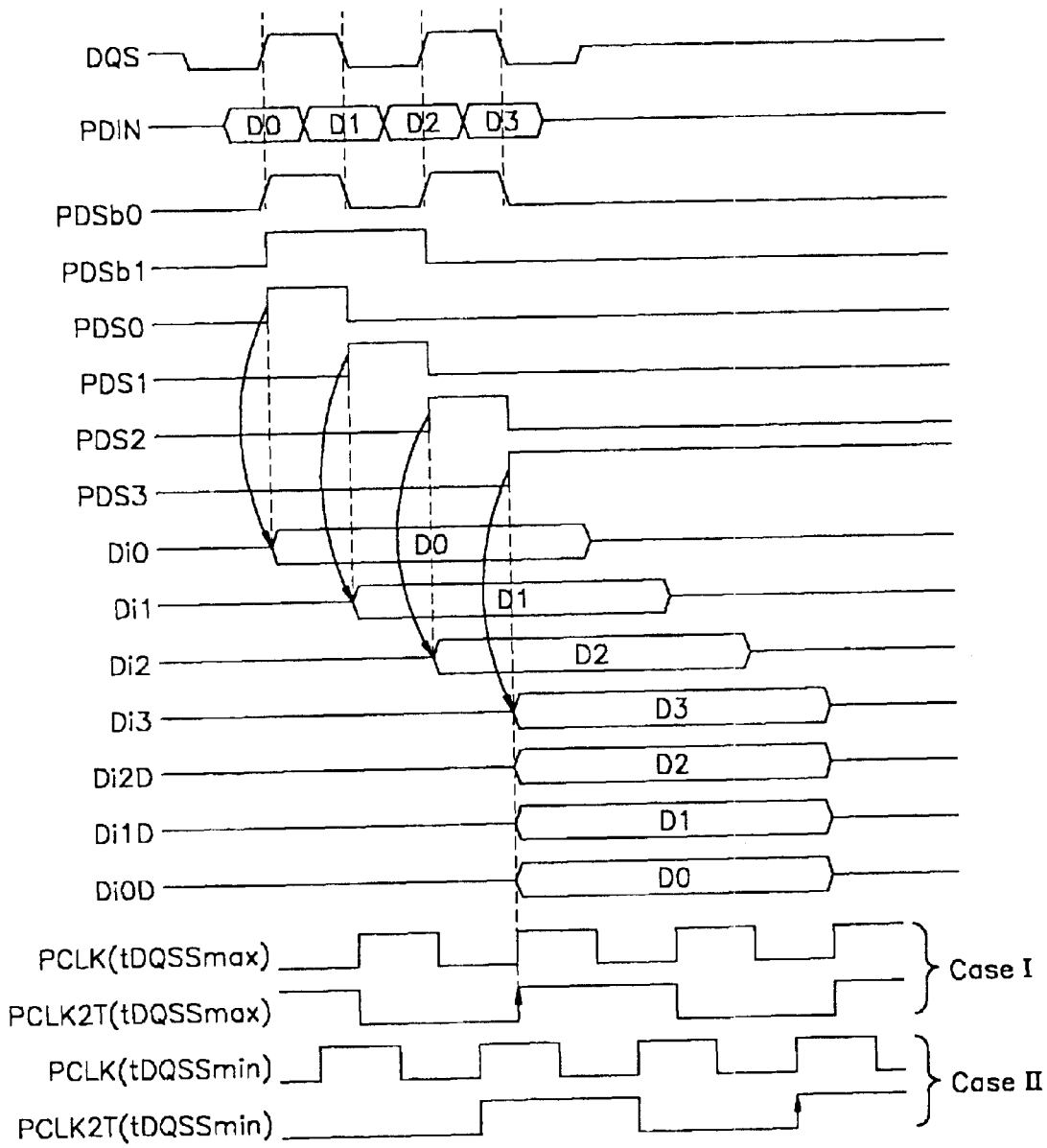
FIG. 5 is a timing diagram of a write operation of the data input circuit shown in FIG. 4.

FIG. 5 is a timing diagram of a write operation performed by the data input circuit 170. Hereinafter, the data write operation of the 4-bit prefetch data input circuit 170 according to embodiments of the present invention will be described in detail with reference to FIGS. 4 and 5.

The logic circuit 20 includes an internal data strobe division circuit 20a and a plurality of logic gates 1, 3, 5, and 7.

The internal data strobe division circuit 20a is a flip-flop configured to divide by two in frequency the first internal data strobe signal PDSb0. PSDb0 is input at the clock input of the flip-flop to generate a second internal data strobe signal PDSb1 and its complement PDSb1b at the outputs of the flip-flop. A write enabling signal PDIN_en is generated by a memory controller (not shown) and is activated (e.g., transited to logic 'high').

Preferably, the internal data strobe division circuit 20a is comprised of a D-flip flop. An input terminal D and a second output terminal QB of the flip-flop 20a are electrically connected to each other. Other variations in a divide by two circuit known to one skilled in the art can be used to produce the second internal data strobe signals.

Logic gate 20 includes a plurality of logic gates for generating N internal strobe signals, N being the same number as the number of bits of data input at DIN. In the present embodiment, four AND gates are used. Each of the AND gates has as its inputs one of the four combinations of the first and second internal data strobe signals PDSb0 and PDSb1 and their complements PDSb0b and PDSb1b. According to this embodiment, the logic gate 1 outputs a third internal data strobe signal PDS0 by ANDing the first internal data strobe signal PDSb0 and the second internal data strobe signal PDSb1, and the logic gate 3 outputs a fourth internal data strobe signal PDS1 by ANDing an inverted signal PDSb0b of the first internal data strobe signal PDSb0 and the second internal data strobe signal PDSb1.

The logic gate 5 outputs a fifth internal data strobe signal PDS2 by ANDing the first internal data strobe signal PDSb0 and an inverted signal PDSb1b of the second internal data strobe signal PDSb1, and the logic gate 7 outputs a sixth internal data strobe signal PDS3 by ANDing the inverted signal PDSb0b of the first internal data strobe signal PDSb0 and the inverted signal PDSb1b of the second internal data strobe signal PDSb1.

The third internal data strobe signal through the sixth internal data strobe signal PDS0 through PDS3, which are output signals of the logic gates 1, 3, 5, and 7, respectively, have a frequency equivalent to one obtained by dividing the first internal data strobe signal PDSb0 by four. Thus, power consumption of the data input circuit 170 operating in response to the third internal data strobe signal through the sixth internal data strobe signal PDS0 through PDS3 is reduced, and timing margin required for re-synchronization of the data input circuit 170 is increased.

The first latch circuit 10 is comprised of N flip-flops (in this embodiment, N=4); namely, D flip-flops 10a, 10b, 10c, and 10d. Each of the D flip-flops 10a, 10b, 10c, and 10d latches a corresponding one of the N-bit data string from PDIN. The first latch circuit 10 latches data in response to rising edges of the third internal data strobe signal through the sixth internal data strobe signal PDS0 though PDS3. The write enabling signal PDIN_en is assumed to be activated during the latching operation. Each of the D flip-flops 10a, 10b, 10c, and 10d is reset when the write enabling signal PDIN_en is deactivated (i.e., transited to logic 'low').

Operation of the first latch circuit 10 will now be described. The D flip-flop 10a latches first data D0 of the 4-bit data string PDIN in response to a rising edge of the third internal data strobe signal PDS0, and the D flip-flop 10b latches second data D1 of the 4-bit data string PDIN in response to a rising edge of the fourth internal data strobe signal PDS1.

The D flip-flop 10c latches third data D2 of the 4-bit data string PDin in response to a rising edge of the fifth internal data strobe signal PDS2, and the D flip-flop 10d latches fourth data D3 of the 4-bit data string PDIN in response to a rising edge of the sixth internal data strobe signal PDS3.

The second latch circuit 30 includes a plurality of latch circuits, for example, D flip-flops 30a, 30b, and 30c, and latches output signals of the first latch circuits 10a, 10b, and 10c in response to the rising edge of the sixth (or last) internal data strobe signal PDS3.

Thus, output signals Di0D through Di2D of the second latch circuit 30 may have a valid data window corresponding to two clock cycles of internal clock signal PCLK.

The clock frequency-division circuit 50 receives an internal clock signal PCLK and outputs a clock signal PCLK2T which has a frequency of that of the internal clock signal PCLK divided by two. Internal clock signal PCLK is derived from and is synchronous with the system clock. A second command signal PCAS is generated in the semiconductor memory device in response to a column address strobe (CAS). The division takes place when PCAS is activated.

The output circuit 40 outputs the 4 bits of parallel data to the data input driver 190 in response to the clock signal PCLK2T when the write enabling signal PDIN _en is activated.

Referring to FIG. 5, case I denotes a situation where a technical standard tDQSS is maximum (tDQSSmax), and case 11 denotes a situation where the tDQSS is minimum (tDQSSmin).

As shown in FIG. 5, the 4 triggering pulses PDS0 to PDS3 produced by logic circuit 20 are active in turn, with PDS0 active pulse generated when PDSb0 and PDSb1 are both high, PDS1 is active when PDSb0b and PDSb1 are high, PDS2 is active when PDSb0 and PDSb1b are high, and PDS3 is active when PDSb0b and PDSb1b are high. Data input at PDIN are latched with D0 to D3 latched into first latch circuit 10 by PDS0 to PDS3, respectively. Upon activation of the last internal strobe signal PDS3, the second latch circuit 30 is latched to output D0 to D3.

In the semiconductor memory device according to embodiments of the present invention, a data window, both maximum tDQSS and minimum tDQSS, corresponds to two clock cycles of the internal clock signal PCLK, respectively. Thus, a timing margin between the internal clock signal PCLK and the data strobe signal DQS is increased.

Figure 6:
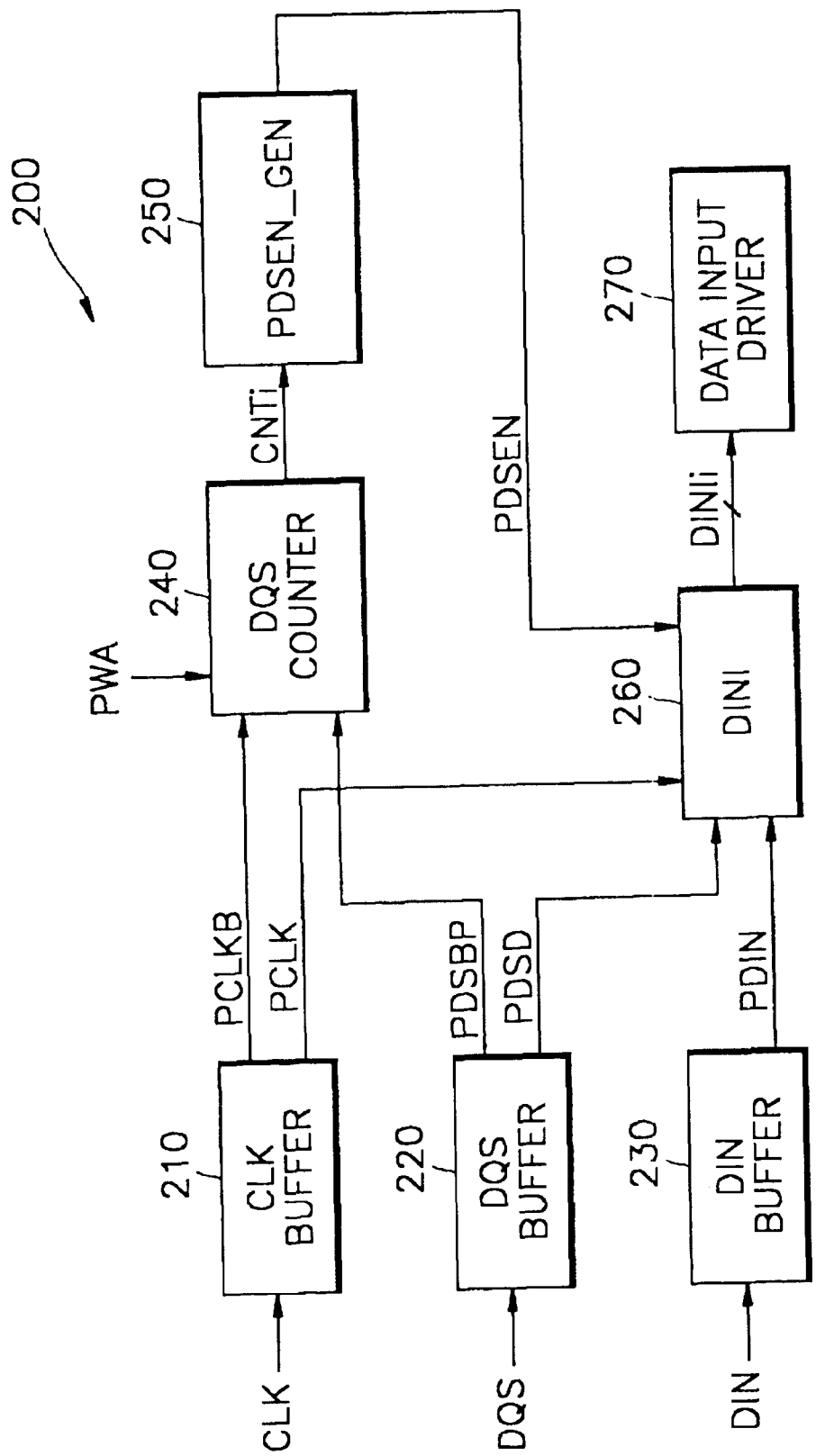
FIG. 6 is a block diagram of a data prefetch circuit according to a second embodiment of the present invention.

According to another embodiment of the present invention, a data input circuit for outputting $2^{(n+1)}$ bits of serial data (where N is an integer) as $2^{(n+1)}$ bits of parallel data in synchronization with the data strobe signal DQS is shown in FIG. 6.

Referring to FIG. 6, the data prefetch system has a structure in which valid data can be stably fetched regardless of variations in tDQSS from minimum to maximum.

Referring to FIG. 6, a data prefetch system 200 includes a clock buffer 210, a data strobe buffer 220, a data input buffer 230, a data strobe counter 240, an indicating signal generating circuit 250, a data input circuit 260, and a data input driver 270.

The clock buffer 210 generates a first internal clock signal PCLK in response to rising edges of an external clock signal CLK and generates a second internal clock signal PCLKB in response to falling edges of the external clock signal CLK. Each of the first internal clock signal PCLK and the second internal clock signal PCLKB can be a pulse.

The data strobe buffer 220 generates a first internal data strobe signal PDSD by buffering a data strobe signal DQS and generates a second internal data strobe signal PDSBP in response to falling edges of the data strobe signal DQS. The second internal data strobe signal PDSBP is a strobe or a pulse signal.

Figure 7:
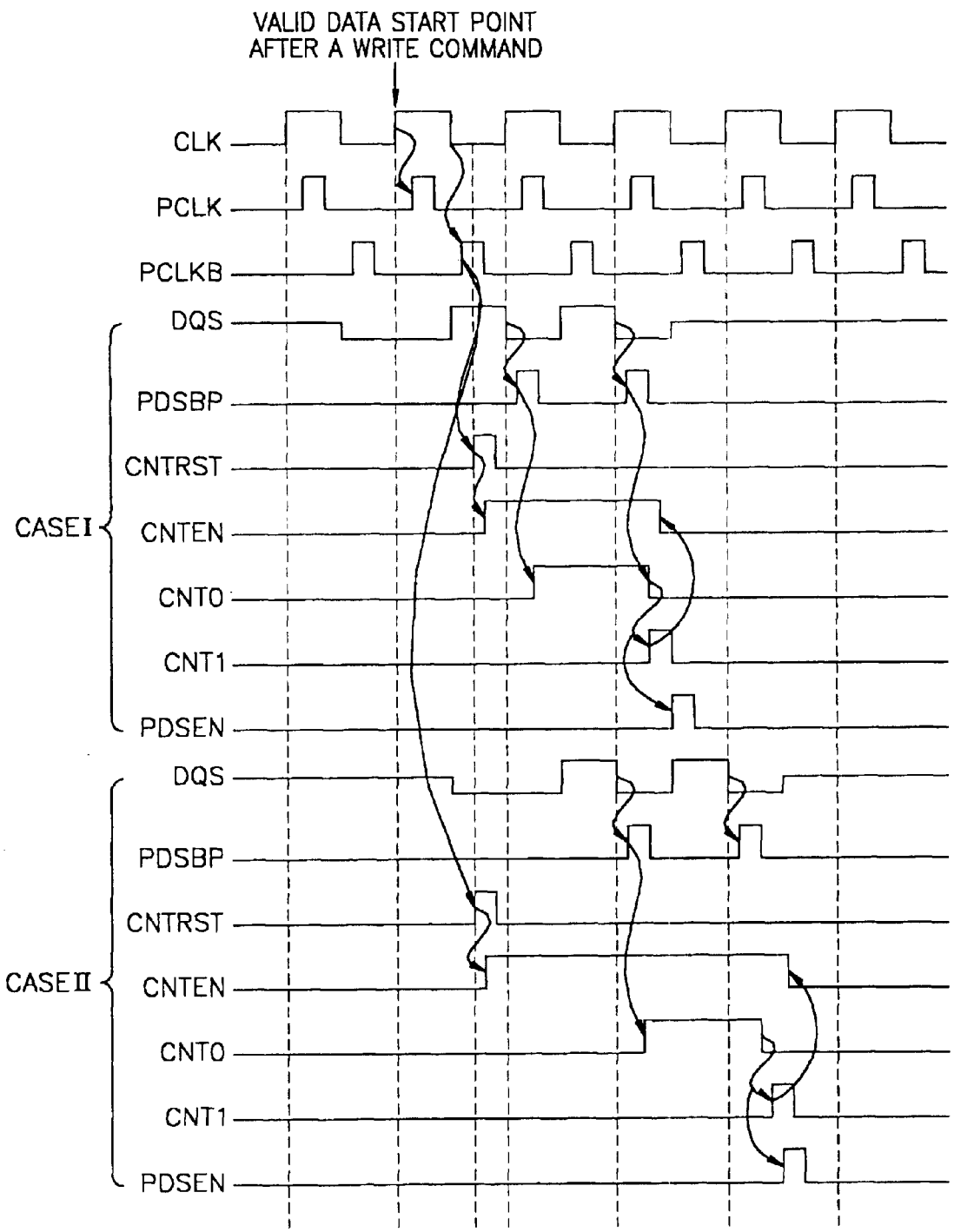
FIG. 7 is a timing diagram of input/output waveforms of the circuit of FIG. 6.

The data input buffer 230 buffers an N-bit data string DIN. As shown in FIGS. 6 and 7, a counter reset signal CNTRST is generated for initializing the data strobe counter 240 in response to the rising edge of the second internal clock signal PLCKB after a write command. A counter enabling signal CNTEN for activating the data strobe counter 240 is in turn generated in response to a rising edge of the counter reset signal CNTRST.

The data strobe counter 240 counts the number of rising edges of the second internal data strobe signal PDSBP at an interval where the counter enabling signal CNTEN is activated and generates a first count signal CNT0 corresponding to the number of rising edges of the second internal data strobe signal PDSBP.

The data strobe counter is deactivated in response to the second rising edge of the second internal data strobe signal PDSBP. The data strobe counter 240 generates a second count signal CNT1 in response to the deactivation of the first count signal CNT0. The counter enabling signal CNTEN is preferably deactivated in response to the activated second count signal CNT1. Alternatively, it can be deactivated in response to the deactivation of the first count signal CNT0. If the counter enabling signal CNTEN is deactivated, the data strobe counter 240 is deactivated.

For example, the data strobe counter 240 counts the number of the rising edges of the second internal data strobe signal PDSBP. The second internal data strobe signal PDSBP is a pulse signal having a short width generated whenever the data strobe signal DQS is transited from logic 'high' to logic 'low'. The data strobe counter 240 counts the number of falling edges of the data strobe signal DQS between a preamble and postamble. After the data strobe counter 240 has counted all the falling edges of the data strobe signal DQS, the data strobe counter 240 is deactivated. The data strobe counter 240 may also count the number of the valid data strobe pulse through the first data strobe signal PDSD (not shown).

The indicating signal generating circuit 250 generates an indicating signal PDSEN, as an auto pulse signal, in response to an output signal CNTi (where i is equal to 0, 1, 2, 3, ... N) of the data strobe counter 240, that is, in response to the deactivated first count signal CNT0. The indicating signal PDSEN indicates that all the falling edges of the data strobe signal DQS between preamble and post-amble is counted.

The data input circuit 260 latches N bits of serial data PDIN into N bits of parallel data in response to the first internal data strobe signal PDSD, re-latches the N bits of parallel data in response to the indicating signal PDSEN generated after all the N bits of parallel data are latched, and then outputs the latched N bits of parallel data DINli to the data input driver 270 in response to an active edge of the first internal clock signal PCLK generated after the indicating signal PDSEN is generated. The data input driver 270 outputs the N bits of latched parallel data to a memory cell array (not shown).

Figure 8:
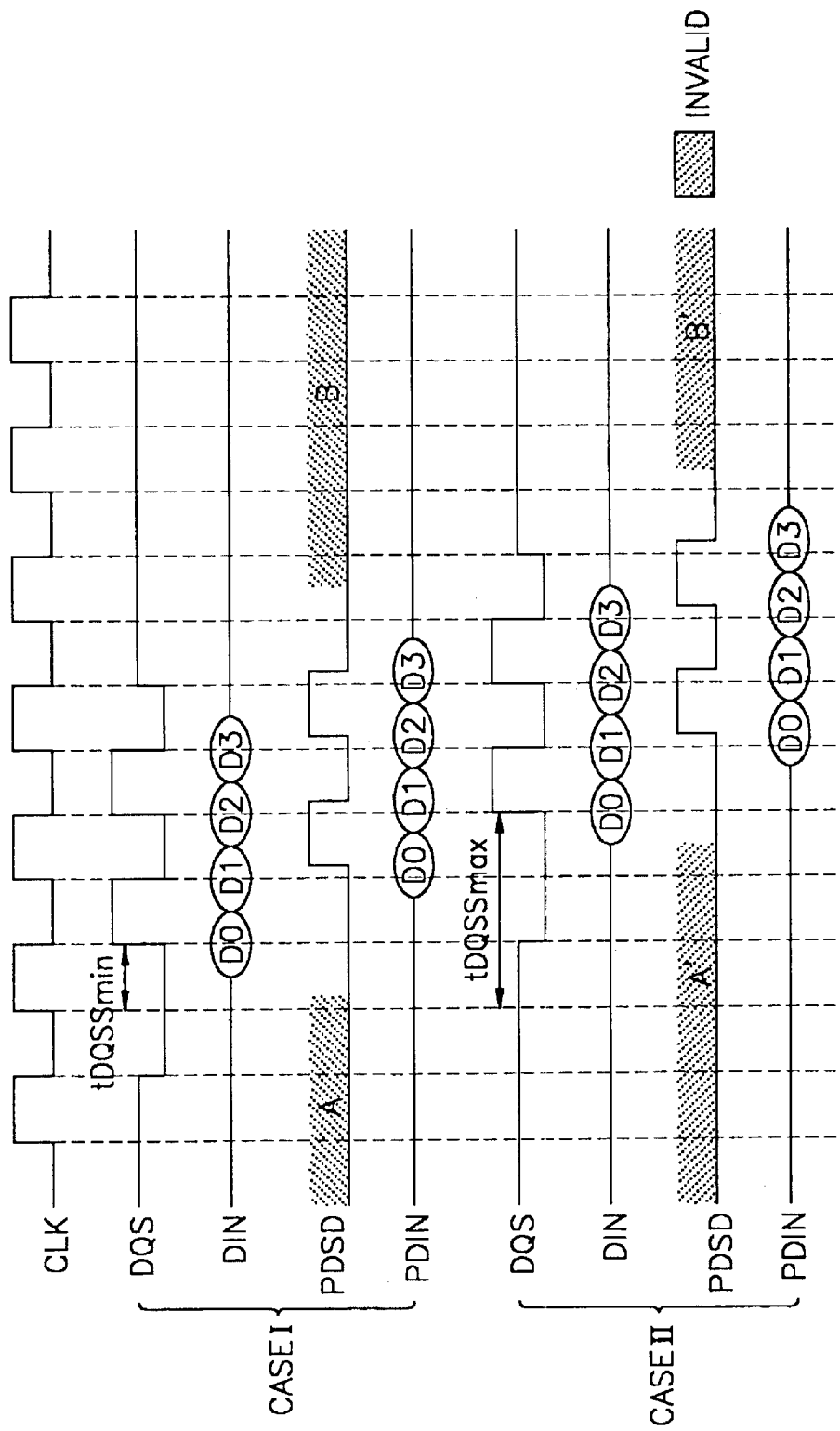
FIG. 8 shows the timing between a data strobe buffer and a data input buffer within a range of minimum tDQSS and maximum tDQSS.

FIG. 8 is a timing diagram of input/output waveforms of a data strobe buffer and a data input buffer within a range of minimum tDQSS and maximum tDQSS. Case I denotes input/output waveforms of the data strobe buffer 220 and the data input buffer 230 in a situation where tDQSS is minimum (tDQSSmin), and case II denotes input/output waveforms of the data strobe buffer 220 and the data input buffer 230 in a situation where tDQSS is maximum (tDQSSmax). Intervals A, A', B, and B' denotes invalid first internal data strobe signal PDSD.

Figure 9A:
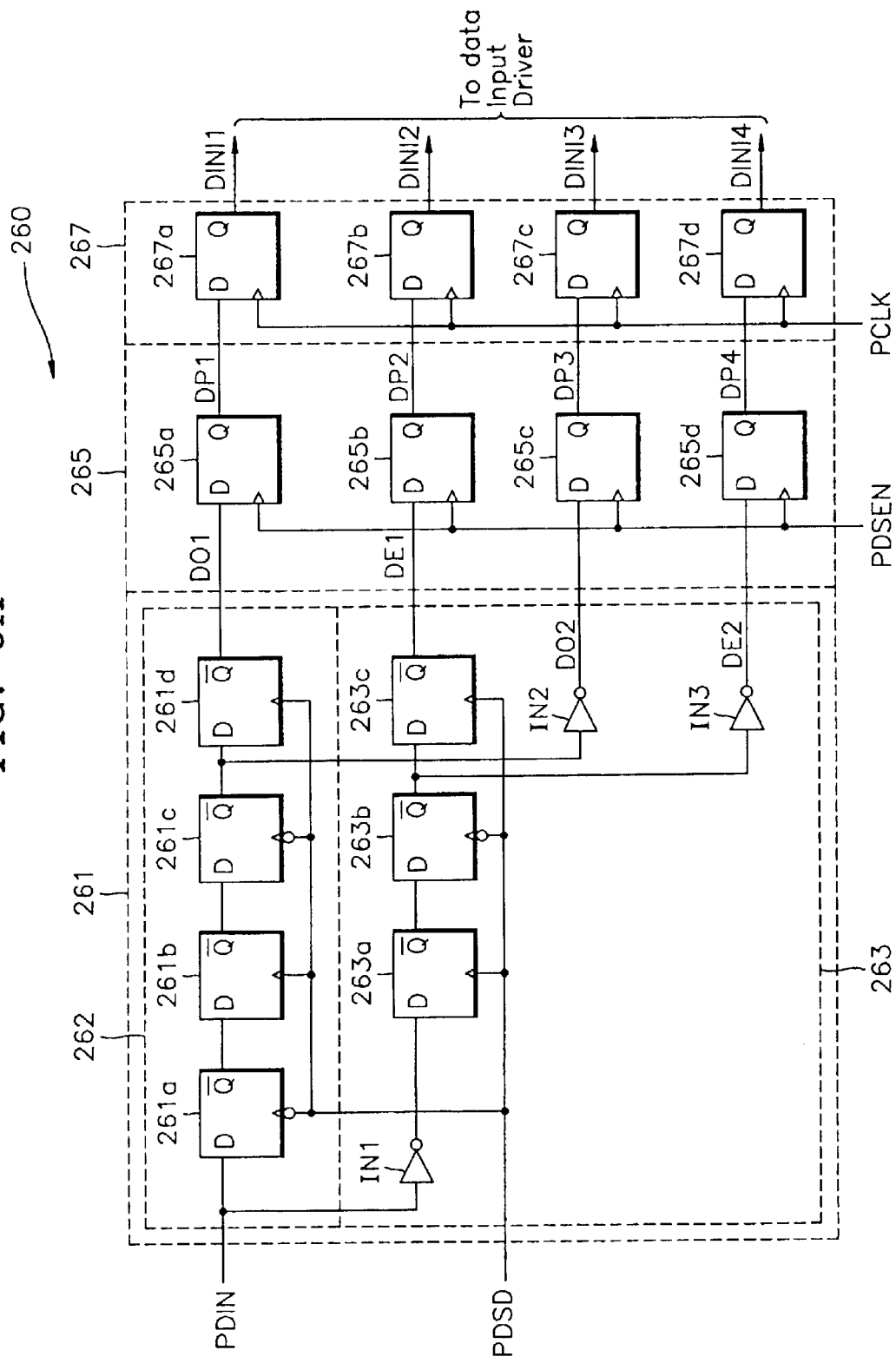
FIG. 9A is a schematic circuit diagram of a data input circuit shown in FIG. 6.

FIG. 9A is a circuit diagram of the data input circuit 260 of FIG. 6. Referring to FIG. 9A, the data input circuit 260 includes a serial input parallel output circuit 261, a first latch circuit 265, and a second latch circuit 267.

The serial input parallel output circuit 261 includes a third latch circuit 262 and a fourth latch circuit 263. The third latch circuit 262 is comprised of a series of latch circuits connected in serial-shift form, for example, four D flip-flops 261a, 261b, 261c, and 261d for responding to the first internal data strobe signal PDSD.

Internal data PDIN are inputted to the D flip-flop 261a in response to the first internal data strobe signal PDSD, and the output terminals of each of the D flip-flops 261a, 261b, and 261c are electrically connected to the input terminals of each of the D flip-flops 261b, 261c, and 261d, respectively.

The third latch circuit 262 includes a number N (where N is an integer) of serial latches so as to latch odd-numbered data of an N-bit data string PDIN. According to the illustrative embodiment of the present invention, N is equal to four (4). Thus, the third latch circuit 262 of the 4-bit prefetch data input circuit 260 is comprised of four D flip-flops and latches odd-numbered data D0 and D2 of the data string PDIN, respectively. The fourth latch circuit 263 includes a plurality of latch circuits and a plurality of inverting circuits IN1, IN2, and IN3. The plurality of latch circuits are comprised of, for example, a plurality D flip-flops 263a, 263b, and 263c for responding to the first internal data strobe signal PDSD. The internal data PDIN are inputted to an input terminal of the inverting circuit IN1, an output terminal of the inverting circuit IN1 is connected to an input terminal of the D flip-flop 263a, an input terminal of the D flip-flop 263b is connected to an output terminal of the D flip-flop 263a, and an input terminal of the D flip-flop 263c is connected to an output terminal of the D flip-flop 263b.

The input terminal of the inverting circuit IN2 is connected to the output terminal of the D flip-flop 261c, and the input terminal of the inverting circuit IN3 is connected to the output terminal of the D flip-flop 263b.

The fourth latch circuit 263 includes a number (N−1) of latch circuits so as to latch even-numbered data of the N-bit data string PDIN. The fourth latch circuit 263 of the data input circuit 260 according to the illustrative embodiment of the present invention wherein N=4 latches even-numbered data D1 and D3 of the data string PDIN. Thus, the serial input parallel output circuit 262 converts the N-bit serial data string PDIN into N bits of parallel data. The third and fourth latch circuits 262 and 263 are configured to activate or latch on both edges of the first internal data strobe signal PDSD. For example, the first flip-flop 261a of the third latch circuit and the first flip-flop 263a of the fourth latch circuit are activated on different edges of PDSD.

The first latch circuit 265 includes a plurality of latch circuits, for example, a plurality of D flip-flops 265a, 265b, 265c, and 265d, and outputs the N bits of latched parallel data DO1, DE1, DO2, and DE2 to the second latch circuit 267 when the indicating signal PDSEN is activated.

The input terminal of the D flip-flop 265a is connected to the output terminal of the D flip-flop 261d, the input terminal of the D flip-flop 265b is connected to the output terminal of the D flip-flop 263c, the input terminal of the D flip-flop 265c is connected to the output terminal of the inverting circuit IN2, and the input terminal of the D flip-flop 265d is connected to the output terminal of the inverting circuit IN3. The first latch circuit 265 for latching N bits of data includes a number N of D flip-flops.

The second latch circuit 267 latches output signals DP1, DP2, DP3, and DP4 of the first latch circuit 265 in response to the rising edge of the first internal clock signal PCLK after an active indicating signal PDSEN pulse and outputs the latched output signals to the data input driver 270 (FIG. 6). The second latch circuit 267 includes a plurality of latch circuits, for example, a plurality of D flip-flops 267a, 267b, 267c, and 267d. The input terminals of the plurality of D flip-flops 267a, 267b, 267c, and 267d are connected to the output terminals of each of the D flip-flops 265a, 265b, 265c, and 265d, respectively.

Figure 9B:
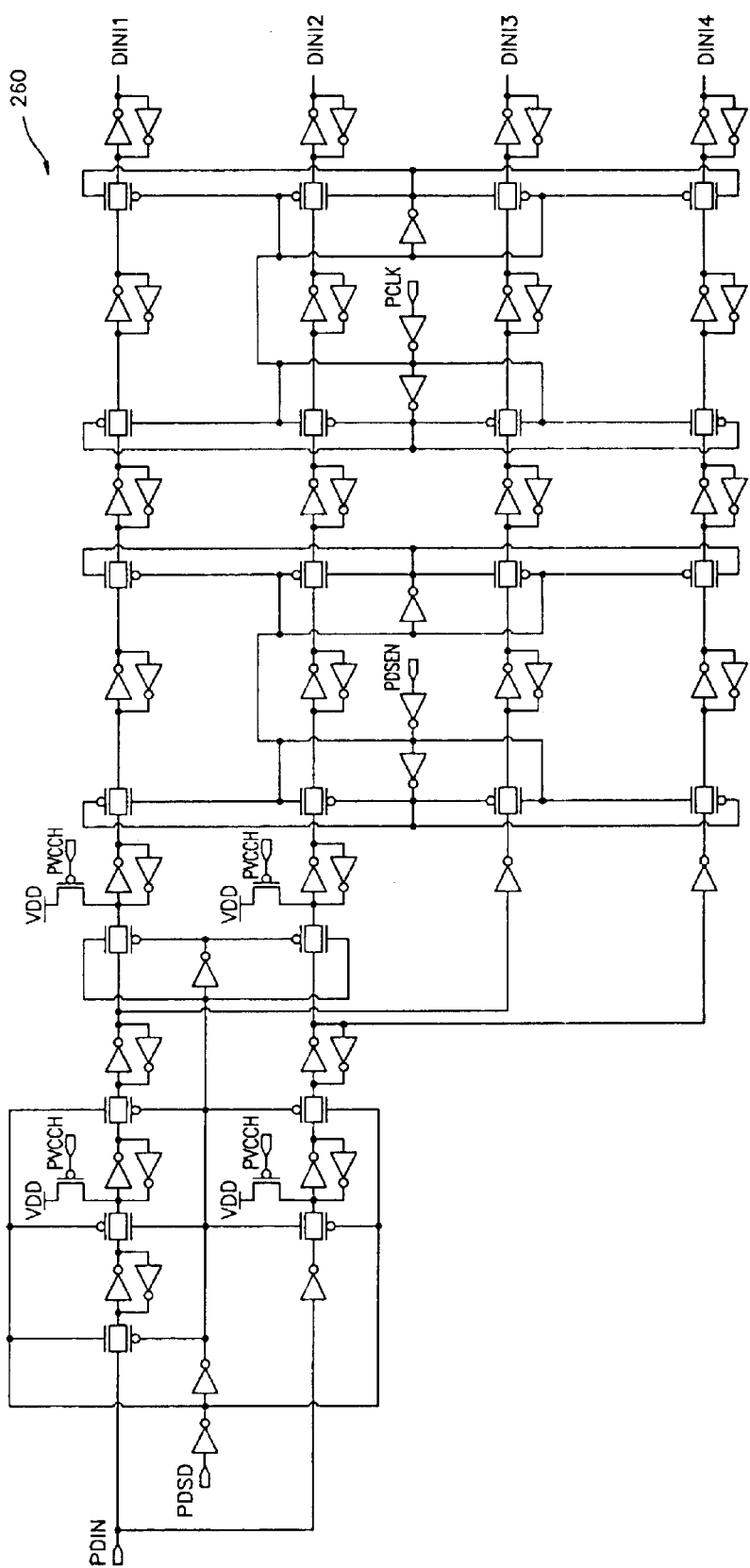
FIG. 9B shows a detailed circuit diagram of the circuit of FIG. 9A.

FIG. 9B shows an exemplary detailed implementation of the circuit of FIG. 9A. It is readily apparent to one skilled in the art that although specific components such as inverters, transistors, and latches are configured as shown in FIG. 9B, the functions and timing of the circuits can be performed by Boolean equivalents or components known to be equivalents.

Figure 10:
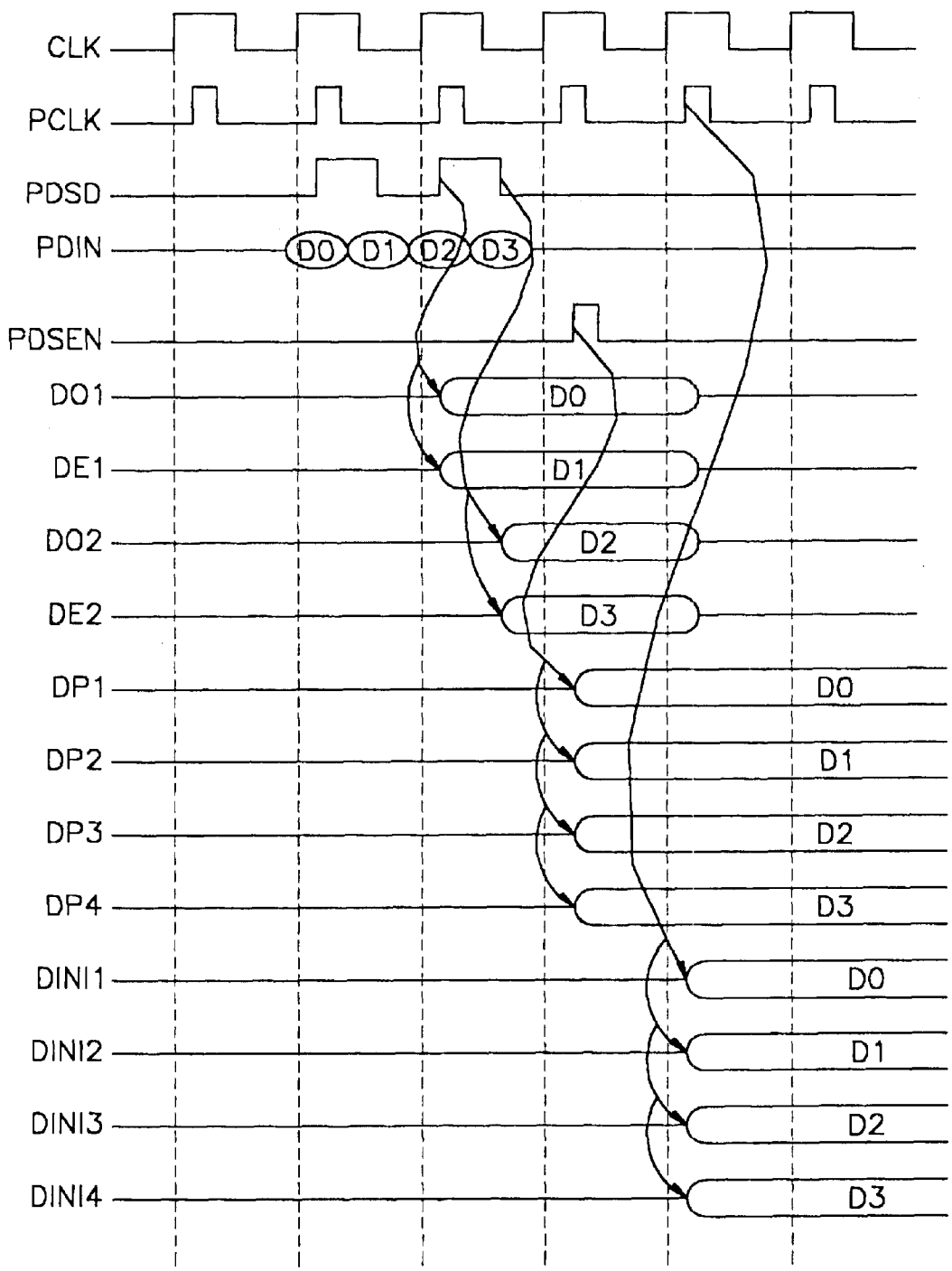
FIG. 10 is a timing diagram of a data prefetch system shown in FIG. 9A.

FIG. 10 is a timing diagram of output data of the serial input parallel output circuit 261, the first latch circuit 265, and the second latch circuit 267 shown in FIGS. 9A and 9B. Referring to FIGS. 9A, 9B and 10, the first latch circuit 265 latches the output data DO1, DE1, DO2, and DE2 of the serial input parallel output circuit 261 in response to an active edge of the indicating signal PDSEN, and the second latch circuit 267 latches the output signals DP1, DP2, DP3, and DP4 of the first latch circuit 265 in response to the rising edge of the first internal clock signal PCLK after the active PDSEN pulse.

The data write operation of the data input circuit 260 will be described in detail with reference to FIGS. 6 through 10 on the basis of the external clock signal CLK into which the valid data strobe signal DQS is input after a write command. For purposes of illustration, the N-bit internal data string PDIN is chosen to be 4 bits long.

First, in the operation of the serial input parallel output circuit 261, the first D flip-flop 261a of the third latch circuit 262 latches a data <D0> when the first internal data strobe signal PDSD is 'low' initially. And then, when the first internal data strobe signal PDSD is transited to a first state (i.e., transited to logic "high") the second D flip-flop 261b latches the data <D0>. And at the same time, a data <D1> is latched by the first D flip-flop 263a of the fourth latch circuit 263. Subsequently, if the first internal data strobe signal PDSD is transited (hereinafter, referred to as "a first falling edge") to a second state (i.e., transited to logic "low"), the data <D0> is latched by the third D flip-flop 261c of the third latch circuit 262, and at the same time, the data <D1> is latched by the second D flip-flop 263b of the fourth latch circuit 263. Also, a data <D2> is latched by the first flip-flop 261a of the third latch circuit 262.

When the first internal data strobe signal PDSD is transited to the first state (hereinafter, referred to as "a second rising edge"), the data <D0> is latched by the fourth D flip-flop 261d, the data <D1> is latched by the third D flip-flop 263c, and the data <D2> is latched by the second D flip-flop 261b. And at the same time, a data <D3> is latched by the first D flip-flop 263a. Subsequently, if the first internal data strobe signal PDSD is transited to the second state (hereinafter, referred to as "a second falling edge"), the data <D2> is latched by the third D flip-flop 261c, and the data <D3> is latched by the second D flip-flop 263b.

Thus, the serial input parallel output circuit 261 converts the 4-bit serial data string PDIN into the 4 bits of parallel data DO1, DE1, DO2, and DE2 in response to the valid data strobe signal DQS.

In the present embodiment according to the invention, the data strobe signal DQS has two falling edges, the first count signal CNT0 is logic-transited twice from logic 'low' to logic 'high', and from logic 'high' to logic 'low'.

Thus, in the case where the data strobe signal DQS has a number N of rising edges and a number N of falling edges at a data strobe enabling interval, the first count signal CNT0 is logic-transited N times, and the indicating signal generating circuit 250 generates the indicating signal PDSEN in response to the N-th (last) logic transition. Thus, the activation signal PDSEN of the 4-bit prefetch data input circuit 260 is generated after the data strobe counter 240 counts the two falling edges.

The first latch circuit 265 latches the output data DO1, DE1, DO2, and DE2 of the serial input parallel output circuit 261 in response to the rising edge of the indicating signal PDSEN. The second latch circuit 267 latches the output signals DP1, DP2, DP3, and DP4 of the first latch circuit 265 in response to the rising edge of the first internal clock signal PCLK after the active PDSEN pulse and outputs the data DINi (where i is equal to 0 through 3) of the second latch circuit 267 to the data input driver 270.

It is appreciated by those skilled in the art that although this methodology of pre-fetch is explained for a case of data to be written at DIN is four bits, the circuit and the methodology are applicable to any number of bits N. Advantageously, the data input circuit and data input method according to the present invention increase a timing margin of tDQSS. Further, a number N of valid data can be pre-fetched regardless of variations in tDQSS.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A circuit for receiving data to be written in a synchronous semiconductor memory device, comprising:
   a first set of latches for receiving an n-bit data upon transition of an internal strobe signal;
   a counter for counting the number of transitions of the internal strobe signal and for outputting an indicating signal upon counting the end of a string of internal strobe signals;
   a second set of latches for receiving the outputs of the first set of latches, the second set of latches being clocked by the indicating signal; and
   a third set of latches for receiving the outputs of the second set of latches, the third set of latches being clocked by a clock signal derived from a system clock.

2. The circuit of claim 1, wherein the counter is clocked by a first clock derived from the system clock.

3. The circuit of claim 2, wherein the first clock is derived from a falling edge of the system clock.

4. The circuit of claim 2, wherein a counter reset signal is generated based on the falling edge of the system clock after a write command, the counter reset signal for resetting the counter.

5. The circuit of claim 2, wherein the first set of latches receives the n-bit data serially under clocking control by the internal strobe signal.

6. The circuit of claim 1, wherein the second set of latches receives the latched n-bit data in parallel.

7. The circuit of claim 1, wherein the indicating signal is output by the counter upon detecting two transitions of the internal strobe signal.

8. The circuit of claim 1, wherein (n) is equal to four.

9. The circuit of claim 1, wherein the clock signal is derived by dividing by two the system clock.

10. The circuit of claim 1, wherein at least one of the first set of latches serially shifts the first and the third of the n-bit data, wherein (n) equals four.

11. The circuit of claim 1, wherein the internal strobe signal is generated from a falling edge of an external data strobe signal.

12. A circuit for receiving data to be written in a synchronous semiconductor memory device, comprising:
   a first set of latches for receiving an n-bit data upon transition of an internal strobe signal;
   a counter for counting the number of falling edges of an external strobe signal and for outputting a counting signal;
   an indicating signal generator for receiving the counting signal outputted from the counter and for outputting an indicating signal;
   a second set of latches for receiving the outputs of the first set of latches, the second set of latches being clocked by the indicating signal; and
   a third set of latches for receiving the outputs of the second set of latches, the third set of latches being clocked by a clock signal derived from a system clock.

13. The circuit of claim 12, wherein the counter is clocked by a first clock derived from the system clock.

14. The circuit of claim 13, wherein the first clock is derived from a falling edge of the system clock.

15. The circuit of claim 13, wherein a counter reset signal is generated based on the falling edge of the system clock after a write command, the counter reset signal for resetting the counter.

16. The circuit of claim 12, wherein the clock signal is derived by dividing by two the system clock.

17. A circuit for receiving data to be written in a synchronous semiconductor memory device, comprising:

- a first set of latches for receiving an n-bit data upon transition of a first internal strobe signal buffered from a data strobe buffer;
- a counter for counting the number of rising edges of a second internal strobe signal outputted from the data strobe buffer and for outputting a counting signal;
- an indicating signal generator for receiving the counting signal outputted from the counter and for outputting an indicating signal;
- a second set of latches for receiving the outputs of the first set of latches, the second set of latches being clocked by the indicating signal; and
- a third set of latches for receiving the outputs of the second set of latches, the third set of latches being clocked by a clock signal derived from a system clock.

18. The circuit of claim 17, wherein the counter is clocked by a first clock derived from the system clock.

19. The circuit of claim 18, wherein the first clock is derived from a falling edge of the system clock.

20. The circuit of claim 18, wherein a counter reset signal is generated based on the falling edge of the system clock after a write command, the counter reset signal for resetting the counter.

21. The circuit of claim 17, wherein the clock signal is derived by dividing by two the system clock.

* * * * *